(12) United States Patent
Nathawad et al.

(10) Patent No.: US 7,728,676 B2
(45) Date of Patent: Jun. 1, 2010

(54) VOLTAGE-CONTROLLED OSCILLATOR WITH CONTROL RANGE LIMITER

(75) Inventors: Lalitkumar Nathawad, Costa Mesa, CA (US); Justin Hwang, Mountain View, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 0 days.

(21) Appl. No.: 12/112,914

(22) Filed: Apr. 30, 2008

(65) Prior Publication Data

US 2009/0072910 A1 Mar. 19, 2009

Related U.S. Application Data

(60) Provisional application No. 60/973,143, filed on Sep. 17, 2007.

(51) Int. Cl.
*H03L 7/00* (2006.01)
(52) U.S. Cl. .................... 331/16; 331/17; 331/167; 331/117 R; 331/177 R
(58) Field of Classification Search .............. 331/16, 331/167, 177 R, 17, 117 R
See application file for complete search history.

(56) References Cited

U.S. PATENT DOCUMENTS

| 4,904,948 | A | 2/1990 | Asami |
| 5,936,430 | A | 8/1999 | Patterson |
| 6,002,273 | A | 12/1999 | Humphreys |
| 6,285,225 | B1 | 9/2001 | Chu et al. |
| 6,326,859 | B1 * | 12/2001 | Goldman et al. ............ 331/143 |
| 6,404,240 | B1 | 6/2002 | Hakkal et al. |
| 6,404,289 | B1 | 6/2002 | Su et al. |
| 6,496,075 | B2 * | 12/2002 | Justice et al. ................ 331/11 |
| 6,556,093 | B2 * | 4/2003 | Craninckx et al. ...... 331/117 R |
| 6,570,453 | B2 | 5/2003 | Su et al. |
| 6,683,478 | B2 | 1/2004 | Yoo |
| 6,731,176 | B2 | 5/2004 | Su et al. |
| 7,075,383 | B2 | 7/2006 | Adachi et al. |
| 7,375,557 | B2 | 5/2008 | Cho |
| 2006/0145771 | A1 * | 7/2006 | Strange ....................... 331/16 |
| 2006/0238265 | A1 * | 10/2006 | Soltanian et al. ............ 331/167 |

OTHER PUBLICATIONS

"U.S. Appl. No. 12/120,827 Office Action", Oct. 9, 2009, 10 pages.

* cited by examiner

*Primary Examiner*—Joseph Chang
*Assistant Examiner*—Jeffrey Shin
(74) *Attorney, Agent, or Firm*—DeLizio Gilliam, PLLC

(57) ABSTRACT

A voltage-controlled oscillator (VCO) comprising a first circuit, a second circuit, a comparator circuit, and a control unit. The first circuit can determine an output common mode voltage associated with an output of the VCO. The second circuit can generate an upper control voltage limit and a lower control voltage limit associated with a control voltage received by the VCO based, at least in part, on the output common mode voltage. The comparator circuit can compare the control voltage to the upper and lower control voltage limits. The control unit can determine whether to change a switched capacitance associated with the VCO based, at least in part, on whether the control voltage is outside the upper and lower control voltage limits, thereby maintaining an optimal region of operation for the control voltage.

22 Claims, 6 Drawing Sheets

VOLTAGE-CONTROLLED OSCILLATOR WITH CONTROL RANGE LIMITER

RELATED APPLICATION

This application claims the priority benefit of U.S. Provisional Application Ser. No. 60/973,143 filed Sep. 17, 2007.

TECHNICAL FIELD

Embodiments of the inventive subject matter generally relate to the field of integrated circuits, and, more particularly, to voltage-controlled oscillators.

BACKGROUND

A voltage-controlled oscillator (VCO) is an electronic circuit that produces an oscillating signal with a frequency that is related to a control voltage applied at the input of the VCO. VCOs typically include an inductance/capacitance (LC) tank circuit having at least one variable capacitor, or varactor. Varactors are voltage-tunable capacitors having a capacitance that varies as a function of the DC voltage across the varactor. The one or more varactors in the LC tank circuit typically help adjust the frequency of oscillation of the VCO in response to varying levels of the control voltage. VCOs are used within phase-locked loops (PLLs) for various applications, such as wired and wireless communications.

SUMMARY

Various embodiments are disclosed of a method and apparatus for determining control voltage limits associated with a control voltage received by a VCO and controlling a capacitance associated with the VCO based on the control voltage to tune the frequency of oscillation of the VCO. According to one embodiment, a VCO comprises a first circuit, a second circuit, a comparator circuit, and a control unit. The first circuit is operable to determine an output common mode voltage associated with an output of the VCO. The second circuit is operable to generate an upper control voltage limit and a lower control voltage limit associated with a control voltage received by the VCO based, at least in part, on the output common mode voltage. The comparator circuit is operable to compare the control voltage to the upper and lower control voltage limits. The control unit is operable to determine whether to change a switched capacitance associated with the VCO based, at least in part, on whether the control voltage is outside the upper and lower control voltage limits.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary circuits, systems, and methods that embody techniques of the present inventive subject matter. However, it is understood that the described embodiments may be practiced without these specific details. For instance, although examples refer to using an amplifier circuit to determine upper and lower control voltage limits associated with a control voltage based on an output common mode voltage of a voltage-controlled oscillator, in some embodiments, other circuitry can be used to determine the upper and lower control voltage limits based on the output common mode voltage. In other instances, well-known structures and techniques have not been shown in detail in order not to obfuscate the description.

Figure 1:
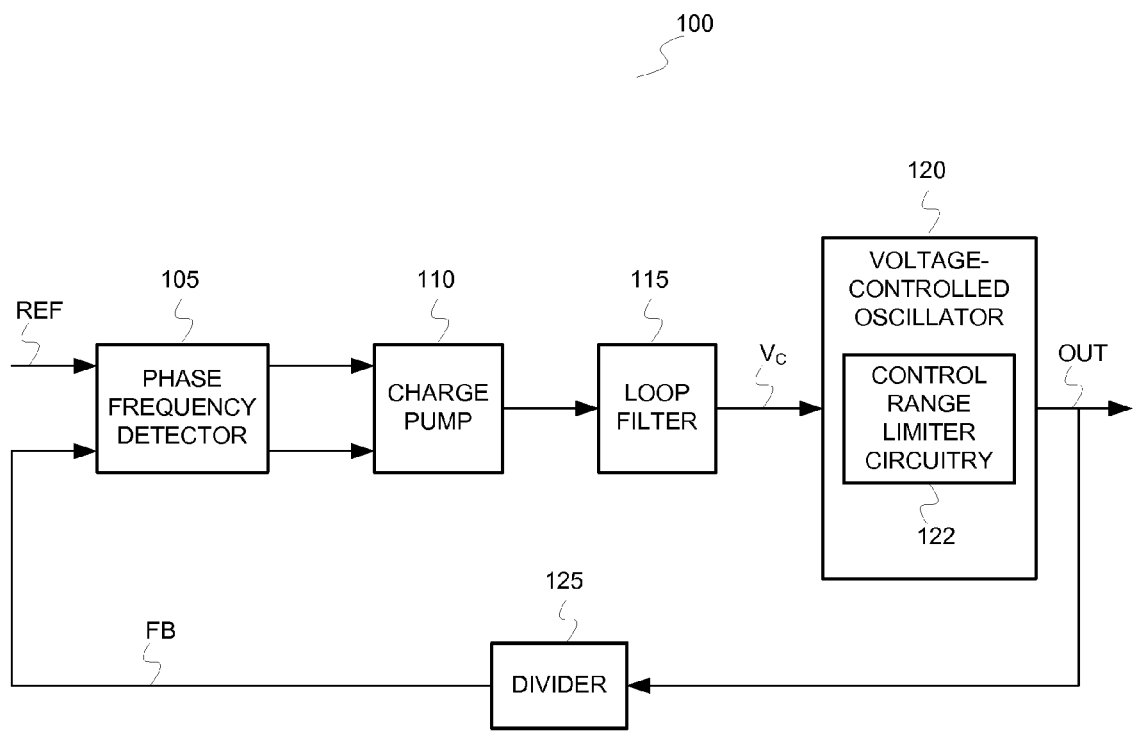
FIG. 1 is a block diagram of one embodiment of a PLL.

FIG. 1 is a block diagram of one embodiment of a phase-locked loop (PLL) 100. As illustrated, the PLL 100 includes a phase frequency detector 105, a charge pump 110, a loop filter 115, a voltage-controlled oscillator (VCO) 120, and a divider 125. The PLL 100 synchronizes an output signal (OUT) generated by the VCO 120 at the output terminal of the PLL with a reference signal (REF) received at one of the input terminals of the PLL with respect to frequency and phase. The output signal of the PLL 100 is first processed within the feedback loop of the PLL to generate a feedback signal (FB). The PLL 100 can then compare the frequency and phase difference between the reference signal and the feedback signal to determine whether to adjust the output signal of the PLL 100 to achieve or maintain a specific phase and frequency relationship between the output signal and the reference signal, i.e., a locked state. In one example, if the feedback loop of the PLL 100 includes divide-by-N circuitry, the frequency of the output signal can be an integer multiple of the reference signal. In another example, if the PLL 100 is configured as a fractional-N PLL, the frequency of the output signal can be a non-integer (or fractional) multiple of the reference signal.

During operation, the phase frequency detector 105 compares the phase and frequency of the feedback signal to that of a reference signal. Based on the results of the comparison, the phase frequency detector 105 provides one or more control signals to the charge pump 100. The charge pump 100 generates a control voltage $V_C$ for the VCO 120 based on the one or more control signal from the phase frequency detector 105 and provides the control voltage $V_C$ to the VCO 120. The loop filter 115 (e.g., a low-pass filter) filters the control voltage $V_C$ before it is provided to the VCO 120. The control voltage $V_C$ controls the frequency of oscillation of the output signal of the VCO 120. The divider 125 in the feedback of the PLL 100 determines whether the output signal of the PLL is an integer multiple or a non-integer multiple of the reference signal.

The VCO 120 receives the control voltage $V_C$ and adjusts (or maintains) the frequency of oscillation of the output signal based on the control voltage $V_C$. The VCO 120 comprises control range limiter circuitry 122 for determining upper and lower control voltage limits associated with the control voltage $V_C$ and for controlling a capacitance associated with the VCO based on the control voltage $V_C$ to tune the frequency of oscillation of the VCO, as will be further described below with reference to FIGS. 2A-5.

It should be noted that the components described with reference to FIG. 1 are meant to be exemplary only, and are not intended to limit the invention to any specific set of components or configurations. For example, in various embodiments, one or more of the components described may be omitted, combined, modified, or additional components included, as desired. For instance, in some embodiments, the feedback path of the PLL 100 may not include a divider 125 and/or may include additional circuitry besides the divider 125.

Figure 2A:
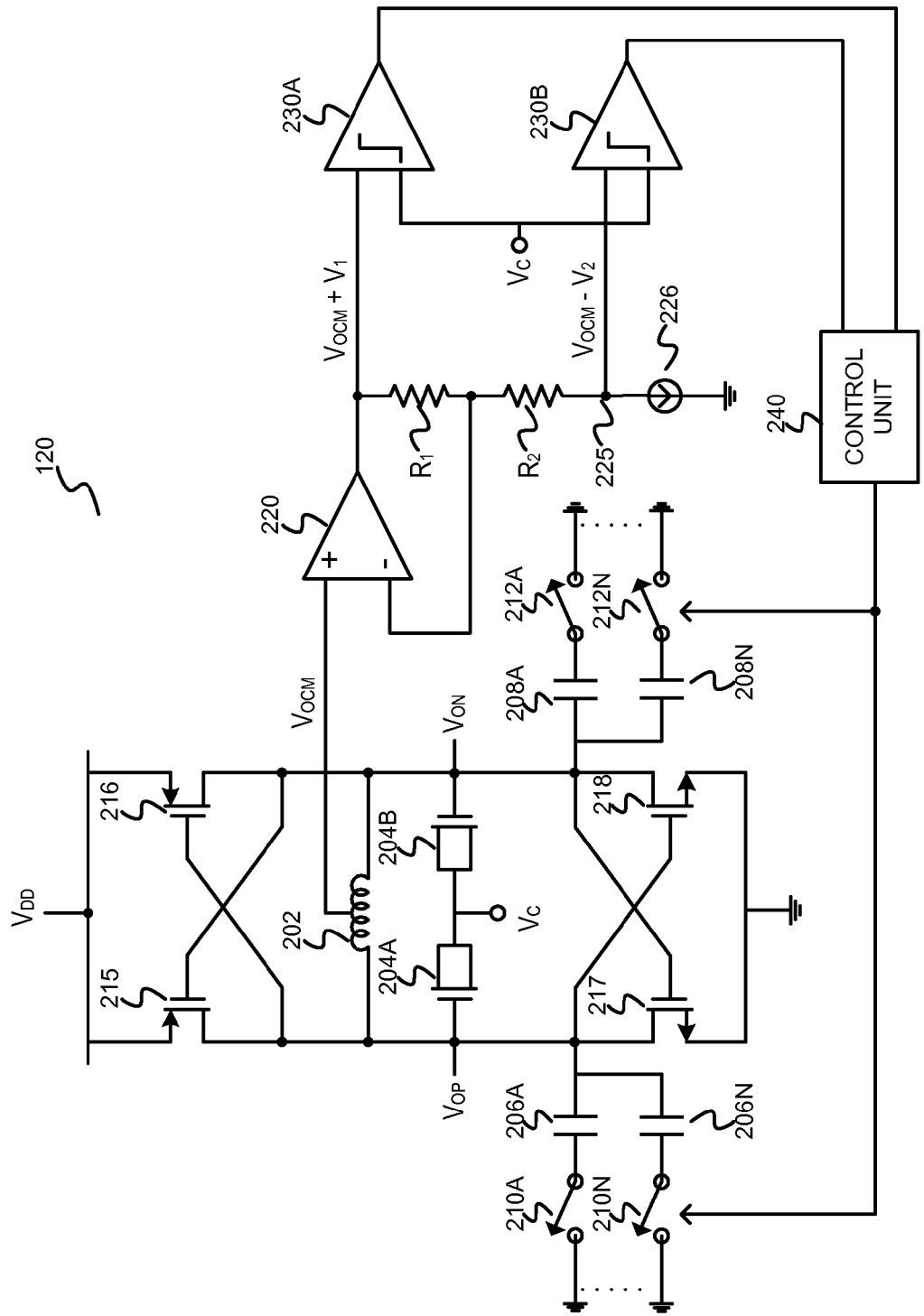
FIG. 2A is a circuit diagram of one embodiment of a VCO with control range limiter circuitry.

FIG. 2A is a circuit diagram of one embodiment of a VCO 120 with control range limiter circuitry. As illustrated, VCO 120 comprises an LC tank circuit, a pair of cross-coupled PMOS transistors 215 and 216, a pair of cross-coupled NMOS transistors 217 and 218, an amplifier circuit, a comparator circuit, and a control unit 240. The LC tank circuit includes a center-tapped inductor 202, varactors 204A and 204B (hereinafter "varactors 204"), switched capacitors 206A-N and 208A-N (hereinafter "capacitors 206" and "capacitors 208"), and switches 210A-N and 212A-N (hereinafter "switches 210" and "switches 212"). It is noted that in various embodiments the varactors 204 are configured as MOS varactors (MOSvars). The amplifier circuit includes amplifier 220, resistor $R_1$, and resistor $R_2$. The comparator circuit includes comparators 230A-B (hereinafter "comparators 230"). The input terminal of the VCO 120 receives a control voltage $V_C$ (e.g., from a loop filter in a PLL, such as loop filter 115 shown in FIG. 1). The control voltage $V_C$ is provided to the varactors 204 for controlling the frequency of oscillation of the VCO 120, and to the comparators 230 for determining whether the control voltage $V_C$ is within a calculated range of control voltages, as will be further described below. The VCO 120 generates an oscillating output from the differential output signals $V_{OP}$ and $V_{ON}$, which is provided to the output terminal of the VCO and, in PLL implementations (e.g., PLL 100 shown in FIG. 1), is also provided to the feedback path of the PLL.

Figure 2B:
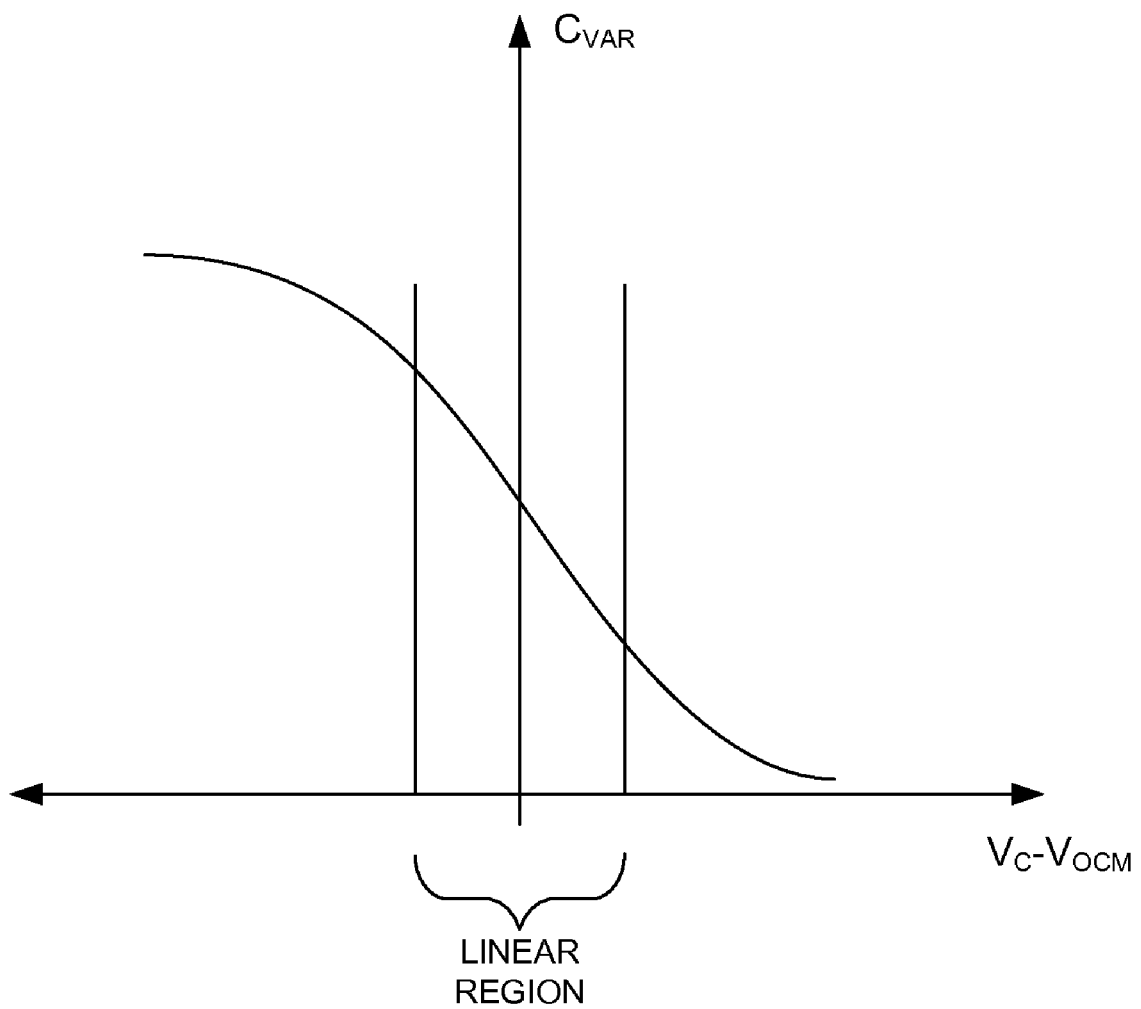
FIG. 2B is a diagram of one example of a C-V curve associated with varactors of the VCO.

The LC tank circuit determines the oscillating frequency of the VCO 120 and the transistors provide gain to amplify the oscillating signal. Within the LC tank circuit, the varactors 104 fine tune the frequency of oscillation of the VCO 120. For each varactor 104, the varactor capacitance is a function of the DC voltage across the varactor, which, in this case, is the differential voltage equal to the control voltage $V_C$ minus the output common mode voltage $V_{OCM}$ associated with the VCO 120. As illustrated in FIG. 2B, the behavior of the varactors 104, with respect to capacitance versus differential voltage (C-V), is nonlinear. At high and low differential voltage values, the varactor capacitance saturates at some minimum and maximum values, respectively. However, there is an in between range of voltage values where the capacitance change with respect to differential voltage is relatively constant and therefore approximately linear. In one implementation, "constant" may be defined to mean within 10% of the nominal value. In another implementation, "constant" may be defined to mean within 15% of the nominal value. It is noted, however, that in other implementations, "constant" can be defined more narrowly, e.g., within 5% of the nominal value, or more broadly, e.g., within 20% of the nominal value. The region of the C-V curve that meets this specification is considered the linear region associated with the varactors 104.

In various embodiments, the VCO control range limiter circuitry determine upper and lower control voltage limits associated with the control voltage $V_C$ based on the measured output common mode voltage $V_{OCM}$ associated with the VCO 120 to bias the control voltage $V_C$ to the linear region of the C-V curve. Since the upper and lower control voltage limits are determined based on the measured output common mode voltage $V_{OCM}$, even if the output common mode voltage $V_{OCM}$ changes, e.g., due to process variations, the upper and lower control voltage limits can change accordingly. In other words, the upper and lower control voltage limits can track the output common mode voltage $V_{OCM}$ such that the control voltage $V_C$ remains in the linear region of the C-V curve. This can ensure that the VCO gain (proportional to the derivative or slope of the C-V curve) remains "constant" over the control voltage range for a particular switched capacitance setting. In PLL implementations, a "constant" VCO gain can help maintain consistent PLL loop dynamics and stability over process variations.

When the control voltage $V_C$ is within the range associated with the upper and lower control voltage limits, the control voltage $V_C$ can be used to change the capacitance associated with the varactors 104 to fine tune the frequency of oscillation of the VCO 120. When the control voltage $V_C$ is outside range associated with the upper and lower control voltage limits, the control unit 240 of the VCO 120 can switch on or off one or more pairs of capacitors 206 and 208 of the LC tank circuit to coarse tune the frequency of oscillation of the VCO such that the control voltage $V_C$ falls within the linear region associated with the varactors 104. The LC tank circuit, the amplifier circuit, the comparator circuit, and the control unit of the VCO 120 are operable to determine the upper and lower control voltage limits associated with the control voltage $V_C$ in order to operate within the linear region associated with the varactors 104, and are operable to tune the frequency of oscillation of the VCO 120 based on a received control voltage $V_C$ (and the control voltage limits) to achieve a locked state, as will be described further below.

During operation, the LC tank circuit of VCO 120 determines the output common mode voltage $V_{OCM}$ associated with the output of the VCO 120 using the center-tapped inductor 202. The LC tank circuit determines the output common mode voltage $V_{OCM}$ based on the differential $V_{OP}$ and $V_{ON}$ output signals, i.e., the average value of the $V_{OP}$ and $V_{ON}$ signals. As illustrated, the output common mode voltage $V_{OCM}$ is generated at the center-tap of the inductor 202. Measuring the output common mode voltage $V_{OCM}$ as seen from the center tap of the inductor 202 positioned between the VCO outputs reduces the amount of noise that is introduced into the measurements. The output common mode voltage $V_{OCM}$ is then provided to the amplifier 220 of the amplifier circuit. It is noted, however, that in other embodiments, the output common mode voltage $V_{OCM}$ can be measured using other circuitry instead of the center-tapped inductor 202, such as an averaging circuit designed to average the differential $V_{OP}$ and $V_{ON}$ output signals without significantly loading the VCO 120.

The amplifier circuit determines an upper control voltage limit and a lower control voltage limit associated with the control voltage $V_C$ received at the input of the VCO 120 based, at least in part, on the output common mode voltage $V_{OCM}$. As illustrated, in some examples, the amplifier circuit receives the output common mode voltage $V_{OCM}$ at the non-inverting input terminal of the amplifier 220. Current source 226 provides a constant current through resistors $R_1$ and $R2$. Since there is a constant current $I_R$ through resistors $R_1$ and $R_2$, and $I_R*R_1=V_1$ and $I_R*R_2=V_2$, the amplifier circuit generates an output of $V_{OCM}+I_RR_1$ or $V_{OCM}+V_1$ at the output terminal of amplifier 220, and $V_{OCM}-I_RR_2$ or $V_{OCM}-V_2$ at node 225. The voltages $V_{OCM}+V_1$ and $V_{OCM}-V_2$ are provided to the comparator circuit to be used as the upper and lower control voltage limit, respectively. It is noted, however, that the upper and lower control voltage limits can be determined based on the output common mode voltage $V_{OCM}$ using other types of circuits, e.g., circuits that are designed to add predetermined voltage values to the output common mode voltage $V_{OCM}$ to generate the upper and lower control voltage limits. For instance, in other embodiments, current source 226 can provide a constant resistor-referenced current through the resistors, such that the values for $V_1$ and $V_2$ are constant. That is, the resistor-referenced current can be generated by applying a constant voltage (i.e., the bandgap voltage that ideally does not vary over process or temperature) over an on-chip resistor of the same type as $R_1$ and $R_2$, and thus $V_1$ is this constant voltage times the ratio of $R_1$ to the reference resistor.

The comparator 230A receives the upper control voltage limit and the control voltage $V_C$, and the comparator 230B receives the lower control voltage limit and the control voltage $V_C$. The comparator 230A compares the upper control voltage limit (e.g., $V_{OCM}+V_1$) to the control voltage $V_C$, and the comparator 230B compares the lower control voltage limit (e.g., $V_{OCM}-V_2$) to the control voltage $V_C$. If the control voltage $V_C$ is greater than the upper control voltage limit, the comparator 230A generates a first control signal, and if the control voltage $V_C$ is less than the lower control voltage limit, the comparator 230B generates a second control signal. In one example, if the control voltage $V_C$ is greater than the upper control voltage limit, the comparator 230A enables the first control signal and the comparator 230B disables the second control signal, and if the control voltage $V_C$ is less than the lower control voltage limit, the comparator 230B enables the second control signal and the comparator 230A disables the first control signal. Also, if the control voltage $V_C$ is within the upper and lower control voltage limits, both control signals are disabled. The first and second control signals are then provided to the control unit 240. It is noted, however, that in other embodiments various types of comparator circuits can be used to determine whether the control voltage $V_C$ is within the control voltage limits and to provide an indication to the control unit 240 of how the control voltage $V_C$ compares to the control voltage limits.

The control unit 240 determines whether to change a switched capacitance associated with the LC tank circuit of the VCO 120 based, at least in part, on whether the control voltage $V_C$ is outside the upper and lower control voltage limits. If the control unit 240 receives a first control signal (e.g., an enabled first control signal), which indicates that the control voltage $V_C$ is greater than the upper control voltage limit, the control unit 240 switches on or switches off one or more pairs of the capacitors 206 and 208. For instance, in response to receiving a first control signal, when the VCO 120 includes a varactor whose capacitance decreases with control voltage $V_C$ (e.g., NMOS varactor shown in FIG. 2A), the control unit 240 may switch off one or more pairs of the capacitors 206 and 208 (i.e., decrease the switched capacitance). In another implementation, when the VCO 120 includes a varactor whose capacitance increases with control voltage $V_C$ (e.g., a PMOS varactor), the control unit 240 may switch on one or more pairs of the capacitors 206 and 208 (i.e., increase the switched capacitance). If the control unit 240 receives a second control signal (e.g., an enabled second control signal), which indicates that the control voltage $V_C$ is less than the lower control voltage limit, the control unit 240 switches on or switches off one or more pairs of the capacitors 206 and 208. For instance, in response to receiving a second control signal, when the VCO 120 includes an NMOS varactor (e.g., FIG. 2A), the control unit 240 may switch on one or more pairs of the capacitors 206 and 208. In another implementation, when the VCO 120 includes a PMOS varactor, the control unit 240 may switch off one or more pairs of the capacitors 206 and 208.

In one example, the control unit 240 can switch on and off the capacitors 206 and 208 by sending control bits to the corresponding switches 210 and 212. It is noted that the control unit 240 can be implemented using hardware and/or software, such as digital circuitry or a state machine implemented on a processing unit, e.g., of a communication device.

In some examples, the range associated with the upper and lower control voltage limits can be relaxed at certain times during operation to build hysteresis into the circuit. For example, during locked operation, the range associated with the upper and lower control voltage limits can be relaxed (i.e., widened) to try to prevent a sudden change in switched capacitance while transmitting or receiving information in a communication system. With reference to the example shown in FIG. 2A, in one specific implementation, the range can be controlled by using programmable resistors $R_1$ and $R_2$ to change the value of $V_1$ and $V_2$, respectively.

As shown in FIG. 2A, the center-tapped inductor 202 is coupled in parallel to the varactors 104. In one example, where the varactors 104 are MOSvars, the varactors 104 are connected such that both the source and drain terminals of the varactor 204A and the source and drain terminals of the varactor 204B are connected to a control voltage $V_C$ input terminal of the VCO 120, the gate terminal of the varactor 204A is connected to the $V_{OP}$ output terminal, and the gate terminal of the varactor 204B is connected to the $V_{ON}$ output terminal. The center-tapped inductor 202 and the varactors 204 can also be connected in parallel to the switched capacitors 206 and 208, to the cross-coupled PMOS transistors 215 and 216, and to the cross-coupled NMOS transistors 217 and 218. The cross-coupled PMOS transistors 215 and 216 are connected to supply $V_{DD}$, and the cross-coupled NMOS transistors 217 and 218 are connected to ground. In some examples, the transistors 215-218 are configured as field-effect transistors (FETs), e.g., MOSFETs.

Additionally, as shown in FIG. 2A, the center tap of the inductor 202 is connected to the non-inverting input terminal of the amplifier 220. The output terminal of the amplifier 220 is connected to a first terminal of resistor $R_1$ and to one of the input terminals of the comparator 230A. A second terminal of resistor $R_1$ is connected to the inverting input terminal of the amplifier 220 and to a first terminal of resistor $R_2$. A second terminal of resistor $R_2$ is connected to a first input terminal of comparator 230B and to current source 226, which is connected to ground.

Furthermore, the control voltage $V_C$ input terminal is connected to the second input terminal of the comparator 230A and to the second input terminal of comparator 230B. The output terminals of comparators 230 are connected to input terminals of the control unit 240. The output terminal of the control unit 240 is connected to the switches 210 and 212, which are connected to the corresponding switched capacitors 206 and 208, respectively.

It should be noted that the components described with reference to FIG. 2A are meant to be exemplary only, and are not intended to limit the invention to any specific set of components or configurations. For example, in various embodiments, one or more of the components described may be omitted, combined, modified, or additional components included, as desired. For instance, in some embodiments, the switches 210 and 212 can be configured as transistors and/or the switched capacitor bank can include a single pair or multiple pairs of capacitors 106 and 108. Furthermore, in some embodiments, one or more of the components of the VCO 120, e.g., the control unit 240, can be implemented using hardware and/or software.

Figure 3:
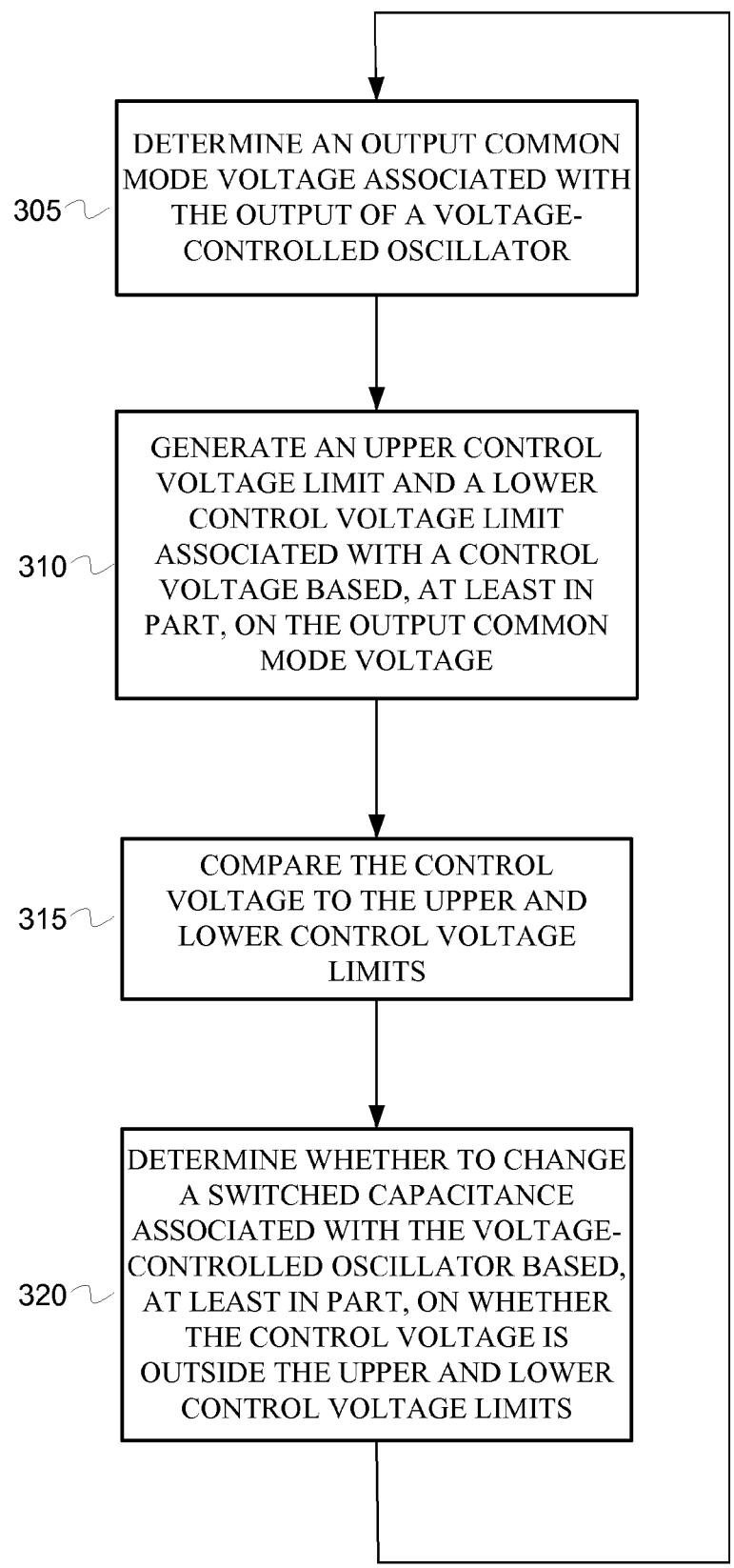
FIG. 3 is a flow diagram of one example of a method for determining control voltage limits associated with a VCO and tuning the frequency of oscillation of the VCO.
Figure 4:
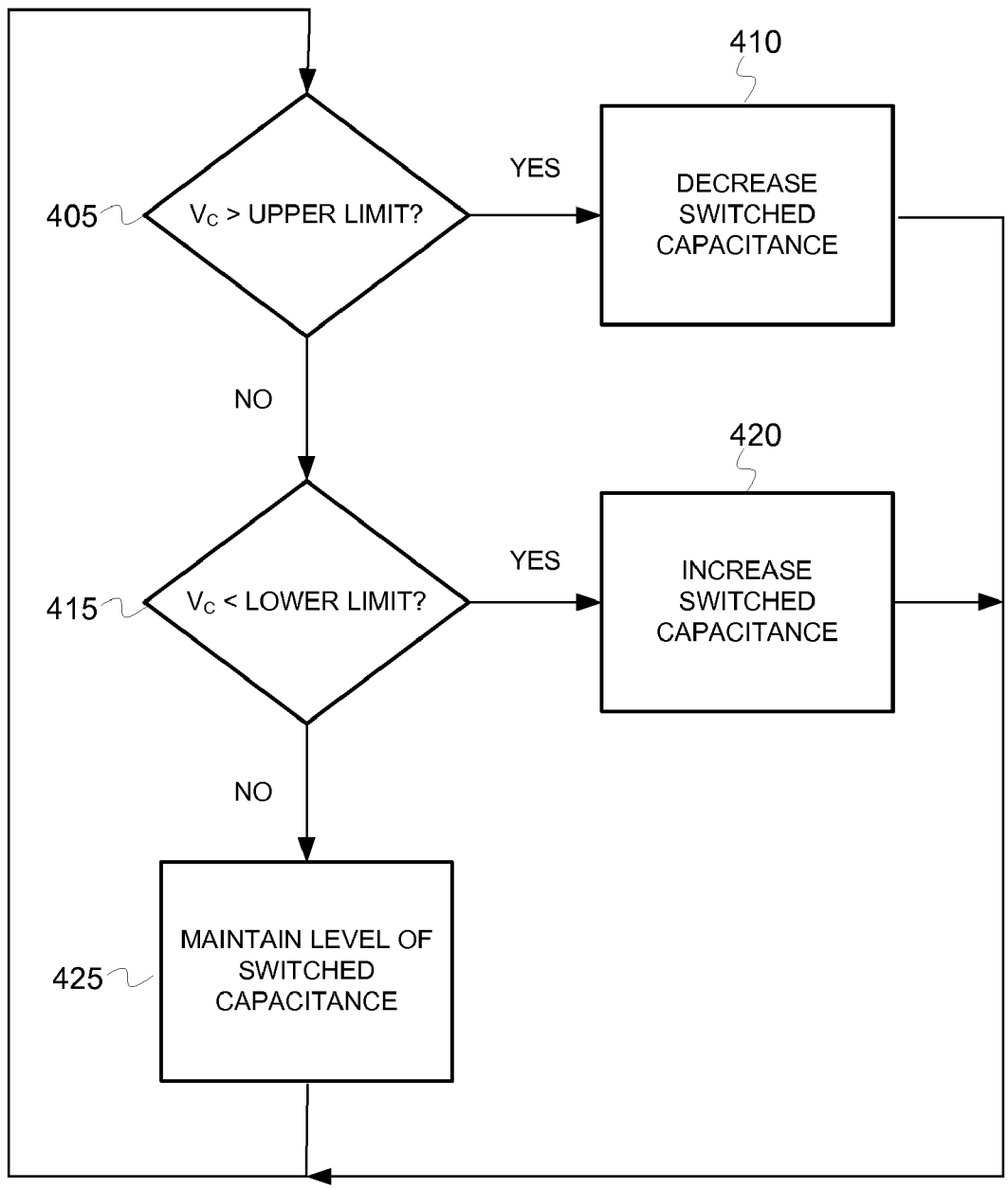
FIG. 4 is a flow diagram of one example of a method for comparing a control voltage received by the VCO to the control voltage limits to determine whether to change the capacitance associated with the VCO.

FIG. 3 is a flow diagram of one example of a method for determining control voltage limits associated with VCO 120 and tuning the frequency of oscillation of the VCO. At block 305, an output common mode voltage $V_{OCM}$ associated with the output of the VCO 120 is determined. For example, the output common mode voltage $V_{OCM}$ can be determined based on the differential $V_{OP}$ and $V_{ON}$ output signals. At block 310, an upper control voltage limit and a lower control voltage limit associated with the control voltage $V_C$ is generated based, at least in part, on the output common mode voltage $V_{OCM}$. For example, a predetermined voltage value $V_1$ can be added to the common mode voltage $V_{OCM}$ to generate the upper control voltage limit, and a predetermined voltage value $V_2$ can be subtracted from the common mode voltage $V_{OCM}$ to generate the lower control voltage limit.

At block 315, the control voltage $V_C$ is compared to the upper and lower control voltage limits. For example, the control voltage $V_C$ is compared to $V_{OCM}+V_1$ and to $V_{OCM}-V_2$. At block 320, it is determined whether to change a switched capacitance associated with the VCO 120 based, at least in part, on whether the control voltage $V_C$ is outside the upper and lower control voltage limits. As shown in the flow diagram of FIG. 4, in one example, if the control voltage $V_C$ is greater than the upper control voltage limit (block 405), then the switched capacitance associated with the LC tank circuit of the VCO 120 is decreased (block 410), and if the control voltage $V_C$ is less than the lower control voltage limit (block 415), then the switched capacitance associated with the LC tank circuit of the VCO 120 is increased (block 420). Also, if the control voltage $V_C$ is within the range associated with the upper and lower control voltage limits, the current level of switched capacitance is maintained (block 425).

It should be understood that the depicted flow diagrams are examples meant to aid in understanding embodiments and should not be used to limit embodiments or limit scope of the claims. Embodiments may perform additional operations, fewer operations, operations in a different order, operations in parallel, and some operations differently. For instance, referring to FIG. 4, the comparison operations with respect to the upper and lower control voltage limits can be performed in parallel.

Figure 5:
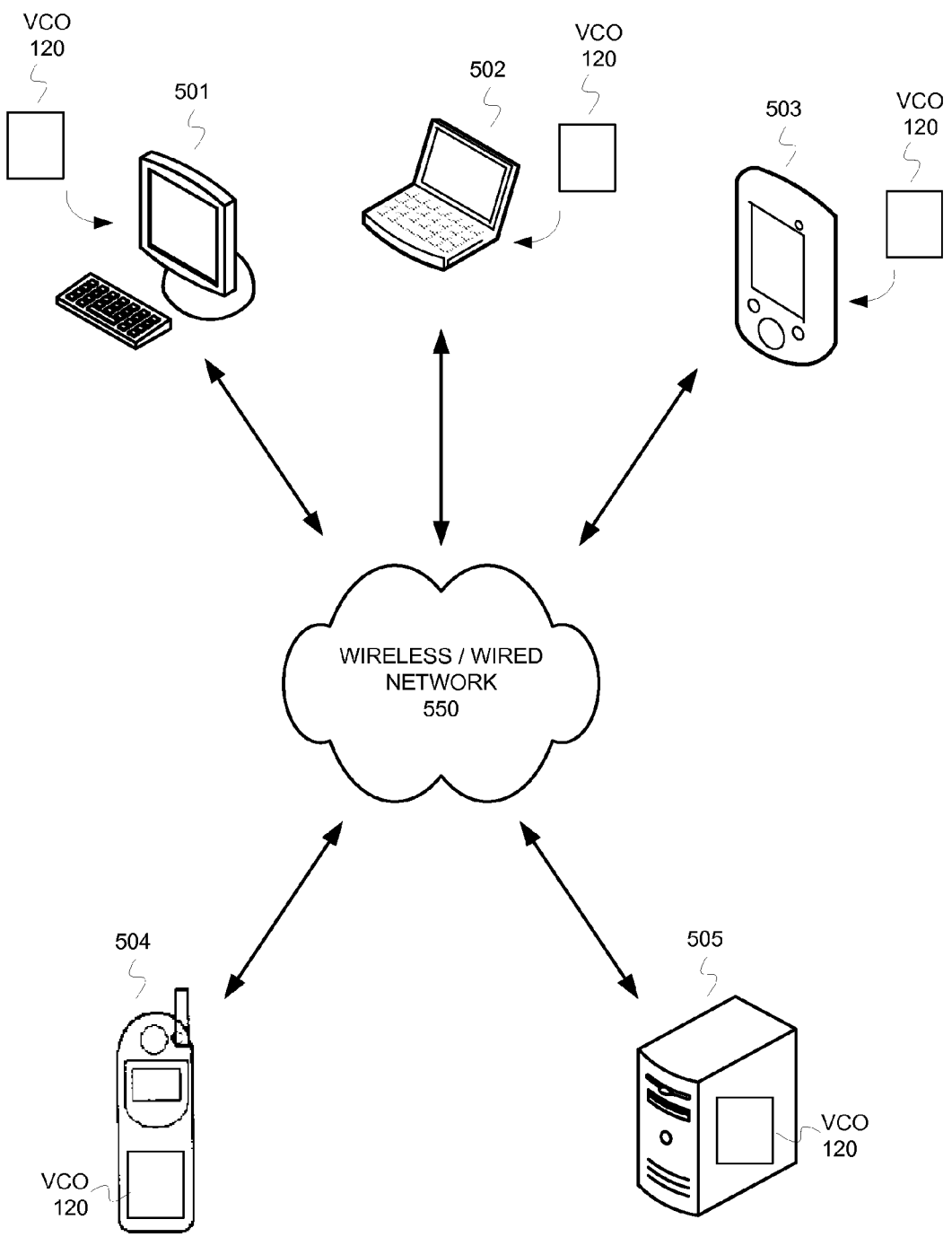
FIG. 5 is a block diagram of one embodiment of a communication system.

FIG. 5 is a block diagram of one embodiment of a communication system. As illustrated, the communication system may include a plurality of communication devices, such as personal computer (PC) 501, laptop 502, global positioning system (GPS) device 503, mobile phone 504, and server 505, transmitting and receiving information via a wireless and/or wired communication network 550. In various implementations, the communication devices comprise a transceiver having a VCO (e.g., VCO 120 of FIG. 2A) operable to implement at least some of the operations and features described above with reference to FIGS. 1-4, such as determining upper and lower control voltage limits associated with a control voltage $V_C$ and controlling a capacitance associated with the VCO based on the control voltage $V_C$ to tune the frequency of oscillation of the VCO. It is noted, however, that in other embodiments the communication system may include other types of communication devices.

While the embodiments are described with reference to various implementations and exploitations, it will be understood that these embodiments are illustrative and that the scope of the inventive subject matter is not limited to them. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A voltage-controlled oscillator (VCO) comprising:
   a first circuit operable to determine an output common mode voltage associated with an output of the VCO;
   a second circuit comprising an amplifier circuit operable to generate an upper control voltage limit and a lower control voltage limit associated with a control voltage received by the VCO, wherein the amplifier circuit is operable to generate the upper control voltage limit based on the output common mode voltage and a first predetermined voltage, and generate the lower control voltage limit based on the output common mode voltage and a second predetermined voltage;
   a comparator circuit operable to compare the control voltage to the upper and lower control voltage limits; and
   a control unit operable to determine whether to change a switched capacitance associated with the VCO based, at least in part, on whether the control voltage is outside the upper and lower control voltage limits.

2. The VCO of claim 1, wherein the first circuit comprises an inductance/capacitance (LC) tank circuit, wherein the LC tank circuit comprises a center-tapped inductor, wherein the LC tank circuit is operable to determine the output common mode voltage associated with the output of the VCO using the center-tapped inductor, wherein the LC tank circuit is operable to provide the output common mode voltage to the second circuit via a center tap of the center-tapped inductor.

3. The VCO of claim 2, wherein the center-tapped inductor of the LC tank circuit is coupled in parallel to a first varactor and a second varactor, wherein the LC tank circuit is operable to determine the output common mode voltage associated with the output of the VCO using the center-tapped inductor, wherein the output common mode voltage is determined based, at least in part, on the average of a first and a second differential output signal of the VCO associated with the first and second varactors.

4. The VCO of claim 1, wherein the amplifier circuit is operable to generate the upper control voltage limit by adding the first predetermined voltage to the output common mode voltage, and generate the lower control voltage limit by subtracting the second predetermined voltage from the output common mode voltage.

5. The VCO of claim 1, wherein, if the control voltage is greater than the upper control voltage limit, the comparator circuit is operable to generate a first control signal, and if the control voltage is less than the lower control voltage limit, the comparator circuit is operable to generate a second control signal.

6. The VCO of claim 5, wherein, in response to receiving the first control signal, the control unit is operable to decrease the switched capacitance associated with the VCO, and in response to receiving the second control signal, the control unit is operable to increase the switched capacitance associated with the VCO.

7. The VCO of claim 5, further comprising a plurality of pairs of switched capacitors, wherein, in response to receiving the first control signal, the control unit is operable to deactivate at least one pair of switched capacitors of the VCO, and in response to receiving the second control signal, the control unit is operable to activate at least one pair of switched capacitors of the VCO.

8. The VCO of claim 1, wherein the first circuit comprises an LC tank circuit, wherein the LC tank circuit comprises a first varactor, a second varactor, and a plurality of pairs of switched capacitors, wherein the first and second varactors are operable to fine tune the frequency of oscillation of the VCO based on the control voltage received by the VCO, wherein the control unit is operable to turn on or off one or more pairs of switched capacitors to coarse tune the frequency of oscillation of the VCO based on whether the control voltage is outside the upper and lower control voltage limits.

9. The VCO of claim 1, wherein the first circuit comprises an LC tank circuit, wherein the LC tank circuit comprises a center-tapped inductor coupled in parallel to a first varactor and a second varactor, wherein the amplifier circuit comprises an amplifier, a first resistor, and a second resistor, wherein the comparator circuit includes a first comparator and a second comparator, wherein an input terminal for the control voltage is coupled to the first and second varactors and to the first and second comparators.

10. The VCO of claim 9, wherein a center tap of the center-tapped inductor is coupled to a non-inverting input terminal of the amplifier, wherein an output terminal of the amplifier is coupled to a first terminal of the first resistor and to a first input terminal of the first comparator, wherein a second terminal of the first resistor is coupled to the inverting input terminal of the amplifier and to a first terminal of the second resistor, wherein a second terminal of the second resistor is coupled to a first input terminal of the second comparator and to a current source, wherein a control voltage input terminal of the VCO is coupled to a second input terminal of the first comparator and to a second input terminal of the second comparator, wherein the output terminal of the first and second comparators are coupled to input terminals of the control unit, wherein the output terminal of the control unit is coupled to a plurality of pairs of switches, wherein the plurality of pairs of switches are coupled to a plurality of pairs of switched capacitors.

11. A method comprising:
 determining an output common mode voltage associated with an output of a voltage-controlled oscillator (VCO), wherein the output common mode voltage is determined using a center-tapped inductor of the VCO and based, at least in part, on the average of a first and a second differential output signal of the VCO;
 generating an upper control voltage limit and a lower control voltage limit associated with a control voltage received by the VCO based, at least in part, on the output common mode voltage;
 comparing the control voltage to the upper and lower control voltage limits; and
 determining whether to change a switched capacitance associated with the VCO based, at least in part, on whether the control voltage is outside the upper and lower control voltage limits.

12. The method of claim 11, wherein said generating an upper control voltage limit and a lower control voltage limit comprises generating the upper control voltage limit by adding a first predetermined voltage to the output common mode voltage, and generating the lower control voltage limit by subtracting a second predetermined voltage from the output common mode voltage.

13. The method of claim 11, wherein said comparing the control voltage to the upper and lower control voltage limits comprises generating a first control signal if the control voltage is greater than the upper control voltage limit, and generating a second control signal if the control voltage is less than the lower control voltage limit.

14. The method of claim 13, wherein said determining whether to change a switched capacitance associated with the VCO comprises deactivating at least one pair of switched capacitors of the VCO in response to receiving the first control signal, and activating at least one pair of switched capacitors of the VCO in response to receiving the second control signal.

15. A phase-locked loop (PLL) comprising:
 a charge pump operable to generate a control voltage;
 a loop filter operable to filter the control voltage; and
 a voltage-controlled oscillator (VCO) operable to receive the control voltage, wherein the control voltage controls the frequency of oscillation associated with the VCO, wherein the VCO comprises:
 a first circuit comprising an inductance/capacitance (LC) tank circuit, wherein the LC tank circuit comprises a center-tapped inductor coupled in parallel to a first varactor and a second varactor, wherein the LC tank circuit is operable to determine an output common mode voltage associated with an output of the VCO using the center-tapped inductor, wherein the output common mode voltage is determined based, at least in part, on the average of a first and a second differential output signal of the VCO associated with the first and second varactors;
 a second circuit comprising an amplifier circuit, wherein the amplifier circuit is operable to generate an upper control voltage limit and a lower control voltage limit associated with the control voltage, wherein the amplifier circuit is operable to generate the upper control voltage limit by adding a first predetermined voltage to the output common mode voltage, and generate the lower control voltage limit by subtracting a second predetermined voltage from the output common mode voltage;
 a comparator circuit operable to compare the control voltage to the upper and lower control voltage limits; and
 a control unit operable to determine whether to change a switched capacitance associated with the VCO based, at least in part, on whether the control voltage is outside the upper and lower control voltage limits.

16. The PLL of claim 15, further comprising a phase frequency detector operable to receive a feedback signal and a reference signal, wherein the phase frequency detector is further operable to compare the phase and frequency of the feedback signal to that of the reference signal and provide one or more control signals to the charge pump based on the comparison.

17. The PLL of claim 15, wherein, if the control voltage received by the VCO is greater than the upper control voltage limit, the comparator circuit is operable to generate a first control signal, and if the control voltage is less than the lower control voltage limit, the comparator circuit is operable to generate a second control signal, wherein, in response to receiving the first control signal, the control unit is operable to decrease the switched capacitance associated with the VCO, and in response to receiving the second control signal, the control unit is operable to increase the switched capacitance associated with the VCO.

18. A voltage-controlled oscillator (VCO) comprising:
a first circuit comprising an inductance/capacitance (LC) tank circuit, wherein the LC tank circuit comprises a center-tapped inductor, wherein the LC tank circuit is operable to determine an output common mode voltage associated with an output of the VCO using the center-tapped inductor;
a second circuit operable to generate an upper control voltage limit and a lower control voltage limit associated with a control voltage received by the VCO based, at least in part, on the output common mode voltage, wherein the LC tank circuit is operable to provide the output common mode voltage to the second circuit via a center tap of the center-tapped inductor;
a comparator circuit operable to compare the control voltage to the upper and lower control voltage limits; and
a control unit operable to determine whether to change a switched capacitance associated with the VCO based, at least in part, on whether the control voltage is outside the upper and lower control voltage limits.

19. The VCO of claim 18, wherein the center-tapped inductor of the LC tank circuit is coupled in parallel to a first varactor and a second varactor, wherein the LC tank circuit is operable to determine the output common mode voltage associated with the output of the VCO using the center-tapped inductor, wherein the output common mode voltage is determined based, at least in part, on the average of a first and a second differential output signal of the VCO associated with the first and second varactors.

20. A voltage-controlled oscillator (VCO) comprising:
a first circuit comprises an inductance/capacitance (LC) tank circuit, wherein the LC tank circuit comprises a center-tapped inductor coupled in parallel to a first varactor and a second varactor, wherein the LC tank circuit is operable to determine an output common mode voltage associated with an output of the VCO;
a second circuit comprising an amplifier circuit, wherein the amplifier circuit comprises an amplifier, a first resistor, and a second resistor, wherein the amplifier circuit is operable to generate an upper control voltage limit and a lower control voltage limit associated with a control voltage received by the VCO based, at least in part, on the output common mode voltage;
a comparator circuit comprising a first comparator and a second comparator, wherein an input terminal for the control voltage is coupled to the first and second varactors and to the first and second comparators, wherein the comparator circuit is operable to compare the control voltage to the upper and lower control voltage limits; and
a control unit operable to determine whether to change a switched capacitance associated with the VCO based, at least in part, on whether the control voltage is outside the upper and lower control voltage limits.

21. The VCO of claim 20, wherein a center tap of the center-tapped inductor is coupled to a non-inverting input terminal of the amplifier, wherein an output terminal of the amplifier is coupled to a first terminal of the first resistor and to a first input terminal of the first comparator, wherein a second terminal of the first resistor is coupled to the inverting input terminal of the amplifier and to a first terminal of the second resistor, wherein a second terminal of the second resistor is coupled to a first input terminal of the second comparator and to a current source, wherein a control voltage input terminal of the VCO is coupled to a second input terminal of the first comparator and to a second input terminal of the second comparator, wherein the output terminal of the first and second comparators are coupled to input terminals of the control unit, wherein the output terminal of the control unit is coupled to a plurality of pairs of switches, wherein the plurality of pairs of switches are coupled to a plurality of pairs of switched capacitors.

22. A method comprising:
determining an output common mode voltage associated with an output of a voltage-controlled oscillator (VCO);
generating an upper control voltage limit and a lower control voltage limit associated with a control voltage received by the VCO based, at least in part, on the output common mode voltage, wherein said generating the upper control voltage limit and the lower control voltage limit comprises generating the upper control voltage limit by adding a first predetermined voltage to the output common mode voltage, and generating the lower control voltage limit by subtracting a second predetermined voltage from the output common mode voltage;
comparing the control voltage to the upper and lower control voltage limits; and
determining whether to change a switched capacitance associated with the VCO based, at least in part, on whether the control voltage is outside the upper and lower control voltage limits.

* * * * *